United States Patent [19]
Sachdev

[11] Patent Number: 5,495,448
[45] Date of Patent: Feb. 27, 1996

[54] MEMORY TESTING THROUGH CUMULATIVE WORD LINE ACTIVATION

[75] Inventor: Manoj Sachdev, Eindhoven, Netherlands

[73] Assignee: U.S. Philips Corporation, New York, N.Y.

[21] Appl. No.: 399,303

[22] Filed: Mar. 6, 1995

[30] Foreign Application Priority Data

Mar. 9, 1994 [EP] European Pat. Off. ............ 94200591

[51] Int. Cl.$^6$ ..................................... G11C 7/00
[52] U.S. Cl. .................. 365/201; 365/194; 365/230.06
[58] Field of Search ..................... 365/201, 194, 365/230.06

[56] References Cited

U.S. PATENT DOCUMENTS

| | | | |
|---|---|---|---|
| 4,779,272 | 10/1988 | Kohda et al. | 365/201 X |
| 5,258,954 | 11/1993 | Furuyama | 365/201 |
| 5,293,340 | 3/1994 | Fujita | 365/201 |
| 5,371,712 | 12/1994 | Oguchi et al. | 365/201 X |

FOREIGN PATENT DOCUMENTS 0102094  5/1988  Japan ..................................... 365/201

OTHER PUBLICATIONS

"A New Testing Acceleration Chip for Low-Cost Memory Tests", M. Inoue et al, IEEE Design & Test of Computers, Mar. 1993, pp. 15–19.

Primary Examiner—David C. Nelms
Assistant Examiner—Son Dinh
Attorney, Agent, or Firm—Steven R. Biren

[57] ABSTRACT

An SRAM has a plurality of respective memory cells coupled to a respective one of a plurality of word lines and to a pair of bit lines. The SRAM comprises $I_{DDQ}$ test means to render the word lines active in parallel by cumulatively increasing a number of active ones among the word lines. This permits the writing of a specific logic state in all cells of a column through the tiny bit line drivers that are progressively assisted by the cells already written, thus avoiding the use of additional heavy write circuitry for $I_{DDQ}$ test purposes only.

6 Claims, 4 Drawing Sheets

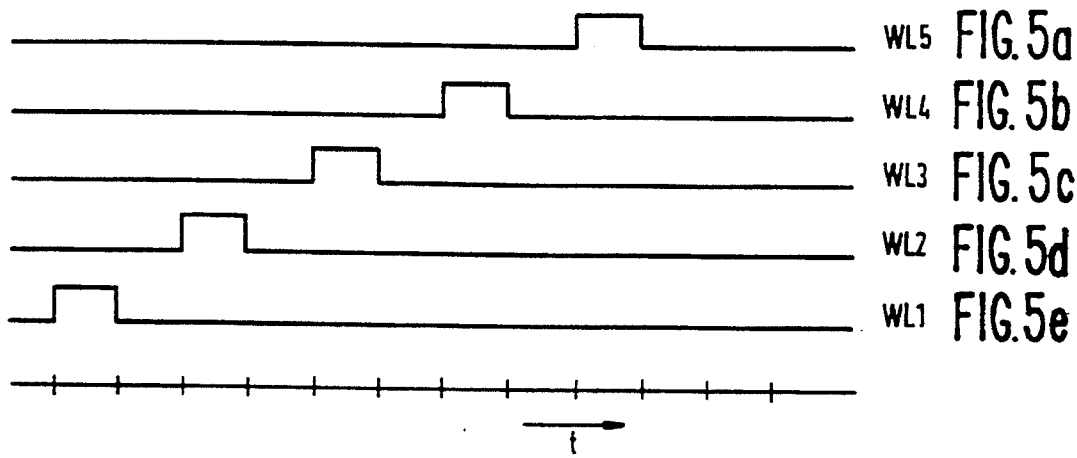
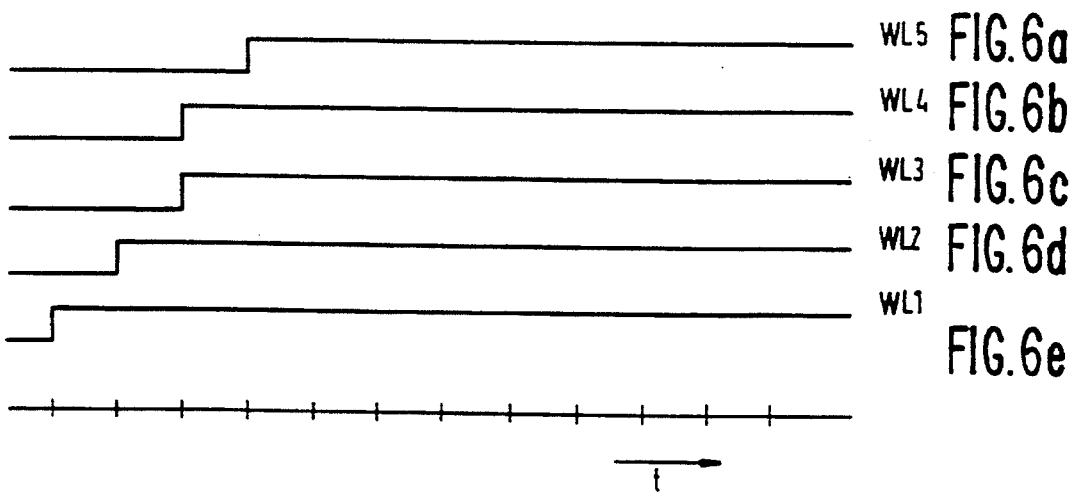

MEMORY TESTING THROUGH CUMULATIVE WORD LINE ACTIVATION

BACKGROUND OF THE INVENTION

The invention relates to an electronic circuit having a plurality of respective memory cells coupled to a respective one of a plurality of word lines and to a pair of bit lines. The invention relates in particular to an SRAM. The invention further relates to a method of testing such a circuit.

Systematic and automatic testing of electronic circuitry, and of integrated circuits in particular, becomes increasingly more important. Each next generation of circuits tends to develop ever higher component densities and an ever growing number of system functionalities. Individual circuits have become complicated to such an extent that process defects cannot be detected and located anymore save by exhaustive and expensive testing. Customers cannot be expected to accept circuitry products that show their hidden defects in operational use, thereby rendering, e.g., life support systems or aircraft control systems, unreliable. It is therefore of the utmost importance for both the manufacturer and the customer that tests are run to guarantee flawless operation of the circuit products.

Random access memories (SRAMs, DRAMs) are usually subjected to march tests and/or data retention tests. In a march test, a sequence of read and/or write operations is applied to every cell of the memory, either in increasing or decreasing address order. In data retention tests, every cell is written and checked after a pre-specified wait-time to see whether or not current leakage has occurred that has affected the stored logic state. Note that memory cells in a bit-oriented memory and groups of memory cells in a word-oriented memory are accessible only one after the other, thus giving rise to lengthy test procedures.

Conventional testing of semiconductor memories that have a storage capacity in the order of 1 Mbit or larger makes up a considerable percentage of the production costs. With increasing transistor densities and with increasing number of system functionalities that are integrated on a semiconductor substrate (including wafer scale devices), testing has become a major factor in determining the commercial viability of an IC memory product. For further information, see "A New Testing Acceleration Chip for Low-Cost Memory Tests", M. Inoue et at., IEEE Design & Test of Computers, March 1993, pp. 15–19.

Quiescent-current testing ($I_{DDQ}$-testing), also referred to as current supply monitoring method (CSM), of an integrated circuit aims at locating process defects by monitoring the steady-state currents. The $I_{DDQ}$-testing technique has shown a lot of promise in the analysis of actual process defects in static CMOS ICs. The quiescent current, or steady-state current, in a CMOS logic circuit should be very small, e.g., in the order of 1 µA. Any deviation is therefore easily detected. The potential of this testing technique is substantial in terms of cost reduction, and of quality and reliability enhancement.

Typical examples of defects occurring in ICs are stuck-at faults and gate-oxide defects. Stuck-at faults are symptoms caused by unintended electrically conductive interconnections between circuit nodes and supply lines, thereby effecting a hard-wired pull-up or pull-down that interferes with the circuit's logic operation. A bridging fault formed by a conductive bridge of low resistance between a supply line and a signal line causes stuck-at phenomena. Impact of gate-oxide defects is often parametric in nature, i.e., not defined in terms of logic voltage levels, and is therefore not detected by conventional voltage methods. Gate-oxide defects may also give rise to stuck-at behaviour. Typically, $I_{DDQ}$-testing detects such faults.

SUMMARY OF THE INVENTION

Although SRAMs can in theory be subjected to $I_{DDQ}$-testing, this is not an attractive option owing to the costs, as the SRAM cells of a column are only individually accessible one at the time. It is an object of the invention to provide a means to efficiently test an SRAM through $I_{DDQ}$-measurements. It is another object to reduce costs involved in testing semiconductor random access memories using $I_{DDQ}$- and/or voltage methods.

To this end, the invention provides an electronic circuit having a plurality of respective memory cells coupled to a respective one of a plurality of word lines and to a pair of bit lines. The invention is characterized, in that the circuit comprises test means operative to render the plurality of word lines active in parallel by cumulatively increasing a number of active ones among the word lines.

In a typical SRAM, cells are organized in rows and columns. The cells of a respective one of the rows are connected to a respective word line and the cells of a respective one of the columns are connected to a common pair of bit lines. In normal use, only one cell per column is accessed to retrieve or store data in the conventional way. That is, among the word lines there is at the most only a single one active at one time. If two (or more) cells of the same column were to be accessed in parallel, this would bring about inefficient duplication when storing data and annihilation when retrieving data. Consequently, such parallel connection is strictly forbidden during normal memory operation.

In the invention, a quiescent current is to be measured in the test mode. Upon entering the test mode, the cells are initialized into a first logic state to measure the quiescent current in this first state. The cells of a column are then all connected in parallel to the bit lines. This requires the word lines to be kept active in parallel for the duration of the quiescent-current measurement. Conventional address decoders are not capable of achieving this. The cells are preferably also initialized into a second logic state to measure the quiescent current in this second state.

Now, before the quiescent current can actually be measured as stated above, the specific logic state is to be written into all cells of a column. Conventionally, this would require as many write cycles as there are cells in a column. Although the bit line drivers are capable of overwriting a single cell, their driving capability is too small to overwrite the cells of an entire column. The test means in the invention, therefore, is operative to cumulatively increase the number of word lines kept active in parallel. This permits the writing of a specific logic state in all cells of a column using the tiny bit line drivers that are progressively assisted by the cells already written, thus avoiding additional heavy drivers that would be required for test purposes only.

This is illustrated as follows by way of example. First, one cell is written by the bit line drivers. Then, two further cells are written using the bit line drivers and the assistance of the cell already written. Since a cell includes two cross-coupled inverters, the bit line drivers and the inverters are driving the two further cells in parallel. Next, four further cells are written, and so on.

For example, the test means is operative to activate the word lines sequentially, i.e., raising each time by unity the number of word lines active in parallel. Alternatively, the test means is operative to activate in parallel a first group of word lines and thereupon to activate in parallel a second group of word lines while the first group is kept active. The respective groups may all have the same number of word lines or may have respective increasing numbers of word lines. Note that two or more columns sharing the same word lines can be handled in parallel in accordance with the invention. Further details are discussed below.

It is clear to the skilled person that SRAM parts such as charge pumps that deliver an increased back-bias voltage, or pre-charge circuitry, are to be deactivated during measurements of the quiescent currents.

Further, the testing of the memory can also be accomplished using off-chip circuitry, e.g., using appropriate probes for contacting the word lines, the method of testing being basically the same as using on-chip circuitry. The method of testing handles a plurality of respective memory cells coupled to a respective one of a plurality of word lines and to a pair of bit lines. The method comprises rendering the plurality of word lines active by cumulatively increasing a number of active ones among the word lines. A particular logic state is written in the cells connected to the word lines lastly made active. A quiescent current is monitored when the plurality of word lines are thus rendered active in parallel.

BRIEF DESCRIPTION OF THE DRAWING

The invention is explained hereinafter by way of example and with reference to the accompanying drawing, wherein:

FIGS. 5 and 6 clarify the temporal relationships between the activation of the word lines in the operational mode and in the test mode.

Throughout the drawing, similar or corresponding features are indicated with the same reference symbols.

DESCRIPTION OF THE PREFERRED EMBODIMENTS

Typically, an SRAM cell comprises a bistable circuit, such as a pair of cross-coupled logic inverters. A logic high is stored by having a first one of the inverters providing a logic high and the other a logic low, whereas a logic low is stored by having the other one of the inverters providing a logic high and the first one a logic low. Each column in an SRAM comprises a pair of bit lines, called bit line and bit line bar. An SRAM cell is coupled to the bit line and to the bit line bar via respective access transistors. Accessing all cells simultaneously and driving all bit lines high (low) and all bit lines bar low (high), permits detection of stuck-at defects and data retention defects relating to a first (second) logic state of the cells.

Principle of sequential activation

Figure 1:
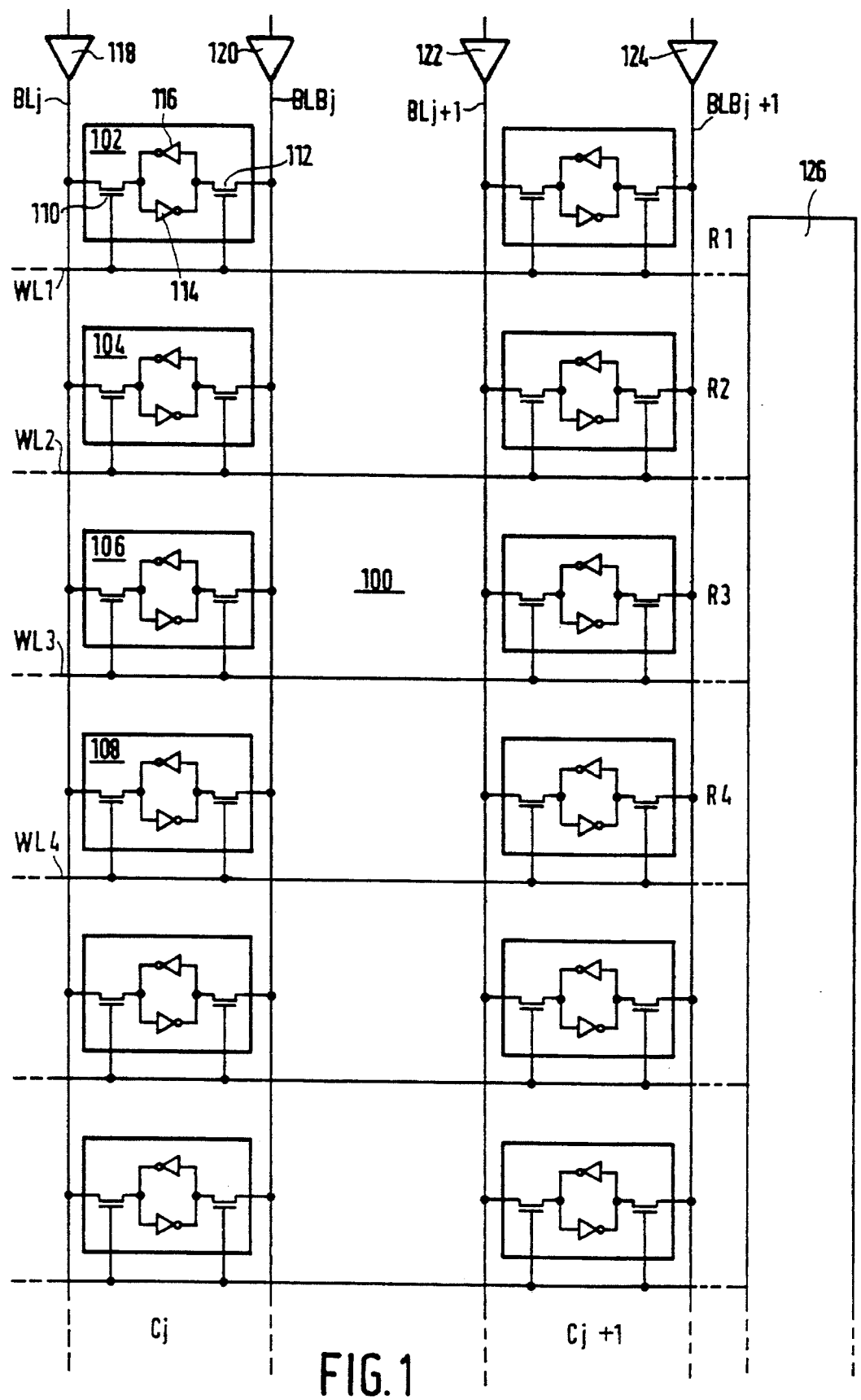
FIG. 1 gives a diagram of a circuit with part of an SRAM.

FIG. 1 gives a block diagram of part of an SRAM 100 to illustrate the principle of the invention. SRAM 100 comprises a plurality of uniform cells, such as cells 102, 104, 106 and 108. The cells are functionally organized in rows and columns. The cells of rows R1, R2, R3 . . . Ri, . . . are connected to word lines WL1, WL2, WL3, . . . , WLi, respectively. The cells of columns Cj and C(j+1) are coupled to bit line BLj and bit line bar BLBj, and bit line BL(j+1) and bit line bar BLB(j+1), respectively.

Since cells 102–108 are uniform, only cell 102 is discussed in further detail below. Cell 102 is located in row R1 and in column Cj. Cell 102 includes a first access transistor 110 that has a current channel connected to bit line BLj and a control electrode connected to word line WL1, and a second access transistor 112 that has a current channel connected to bit line bar BLBj and a control electrode also connected to word line WL1. Cell 102 accommodates a latch, comprising cross-coupled inverters 114 and 116 and connected between the current channels of first and second access transistors 110 and 112. A single bit of information is stored in cell 102 as one of two stable states of latch 114.

SRAM 100 further includes address decoders (not shown), pre-charging logic (not shown), read/write circuitry (not shown), and bit line drivers 118, 120, 122 and 124. Since the address decoders, pre-charging logic and read/write circuitry are all well known conventional parts of an SRAM, neither the implementation of these parts nor their conventional operation is discussed here in further detail.

SRAM 100 also comprises a test means 126 to permit $I_{DDQ}$-testing of the memory. Test means 126 is operative in the test mode to activate word lines WL1, WL2, etc., in such a way that the number of word lines active in parallel is cumulatively increased. First, a particular logic state is written in cell 102 by bit line drivers 118 and 120. Then, the particular logic state is written into two further cells, e.g., cell 104 and 106, using bit line drivers 118 and 120 and the assistance of cell 102 already written. Since cell 102 includes two cross-coupled inverters 114 and 116, bit line drivers 118 and 120 and inverters 114 and 116 are driving cells 104 and 106 in parallel. Next, four further cells are written, and so on.

Eventually, all cells 102, 104, 106, 108 etc. of column Cj or part of column Cj are in the same logic state and are connected to bit line BLj and bit line bar BLBj via their respective access transistors kept conductive. All cells of column Cj or part thereof are now connected in parallel. Any defect that gives rise to an elevated quiescent current in any cell in the particular logic state is revealed through current measurements in the $I_{DDQ}$-test, e.g., by measuring the current drawn from the supply nodes (not shown) of the memory. Mutatis mutandis, an elevated quiescent current can be detected associated with the other logic state of each cell in column Cj or part thereof. In this manner, all cells of a single one, a multitude or all columns are scanned simultaneously, thus realizing a highly efficient quality check of the memory.

Possible defects

Figure 2:
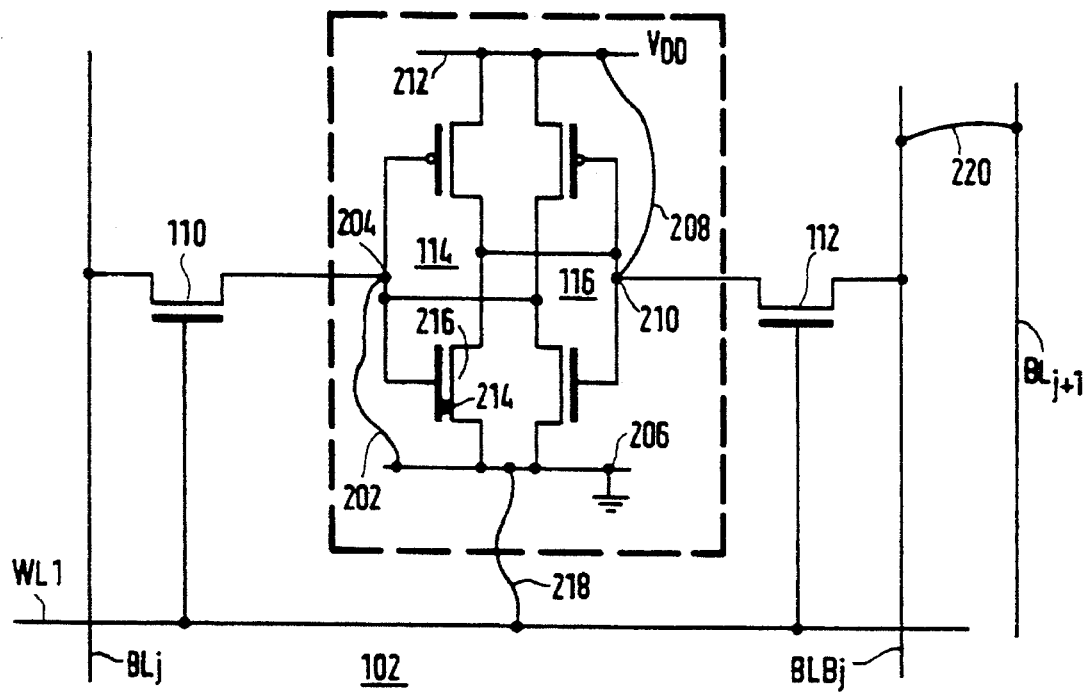
FIG. 2 gives a diagram of a typical SRAM cell illustrating possible defects.

FIG. 2 shows SRAM cell 102 in further detail. Cell 102 may be faulty in a variety of ways. A first type of defect that can occur is a short-circuit 202 from a node 204 to $V_{SS}$ supply line 206 or a short circuit 208 from a node 210 to $V_{DD}$ supply line 212. A second fault could be a gate-oxide defect 214 bridging the gate-oxide of a transistor 216 that is a functional pan of one of the inverters. Defects 202, 208 and 214 can cause memory cell 102 to have either a stuck-at fault or a data retention fault, depending on the resistance of the defect. These defects are conventionally detected by monitoring a Write/Read operation or a data retention test.

However, assume that cell 102 has a gate-oxide defect 214, which causes a current leakage to $V_{SS}$. If a logic 1 is written and read in quick succession, and if the resistance of defect 214 is high enough, the read operation can be successful in finding the same logic value as was written. Therefore, defect 214 may not be detected using conventional test procedures. A quiescent-current measurement traditionally conducted on SRAM 100 is able to detect fault 214. However, cells in a traditional SRAM are only sequentially accessible which implies a lengthy procedure to be carried out. In the invention, the $I_{DDQ}$-test scans all activated cells in parallel to discover this defect. A third possible defect is a short-circuit 218 from word line WL1 to the $V_{SS}$ supply line. This defect prevents access transistors 110 and 112 from being turned on, thereby permanently disabling memory cell 102. The $I_{DDQ}$-measurements in the invention scan all cells in parallel and also detect this type of defect as it gives rise to a relatively large current. A fourth possible fault is a short circuit 220 between bit line bar BLBj and bit line BL(j+1), which is likely to occur in large capacity SRAMs, whose cells are extremely small, typically in the order of 25 $\mu m^2$, and therefore have a small column pitch. This defect 220 is readily detected in an $I_{DDQ}$-test according to the invention by having these adjacent lines supplied with supply voltage $V_{DD}$ and $V_{SS}$ alternately. Above examples may serve to illustrate the powerful test capability of a memory provided with test means according to the invention as all cells can be scanned in parallel.

Test means implementations

Figure 3:
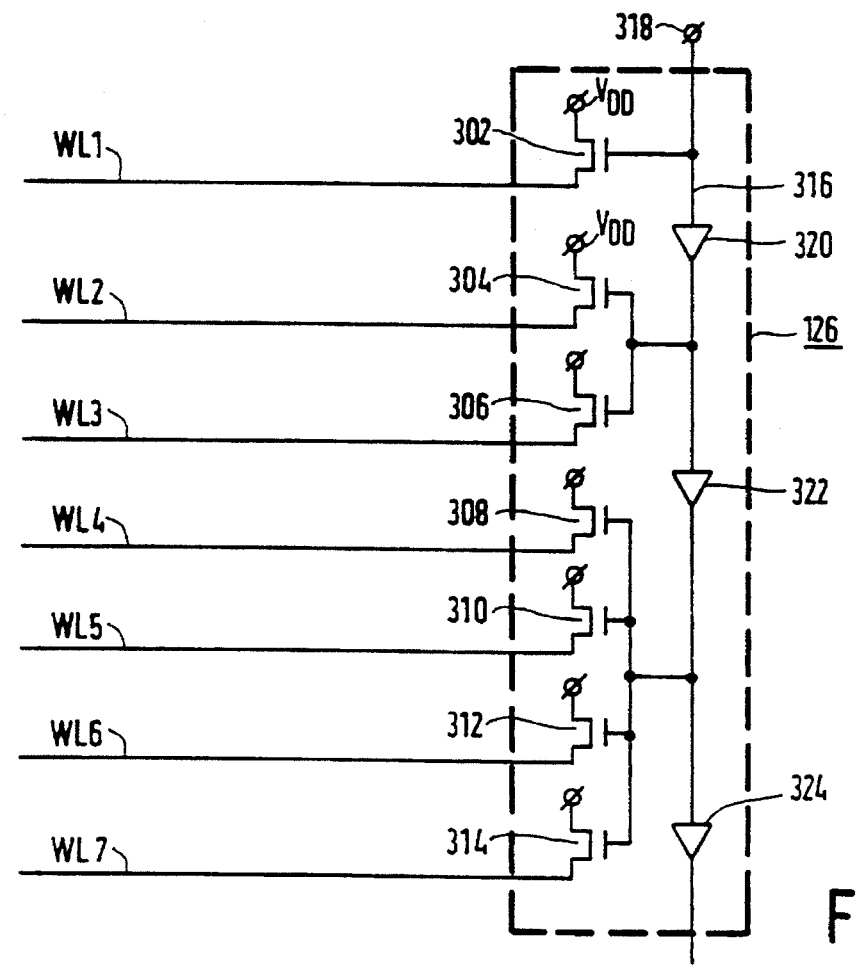
FIGS. 3 and 4 give examples of implementing the test means.

FIG. 3 gives a first implementation of test means 126 operative to sequentially activate respective groups of respective increasing numbers of word lines. FIG. 3 shows only seven word lines WL1–WL7 by way of example. Test means 126 comprises activation transistors 302, 304, 306, 308, 310, 312 and 314, each connecting a respective one of word lines WL1–WL7 to supply voltage $V_{DD}$. Activation transistors 302–314 have their control electrodes connected to a delay line 316. Delay line 3 16 has an input 318 to receive a test signal. Delay line 316 further has delay elements 320, 322, 324, . . . If the test signal is made high at input 318, transistor 302 is turned on, thereby activating word line WL1. The bit line drivers of one or more columns then can write the desired logic state in the cells, e.g., cell 102, connected to word line WL1 as specified above. After a delay determined by delay element 320, the test signal turns on transistors 304 and 306 simultaneously. As discussed above, bit line buffers 118 and 120 now are assisted by the previously written cell (e.g., cell 102) in writing the cells connected to word lines WL2 and WL3. Upon a delay specified by delay element 322, transistors 308–314 are turned on, thereby activating word lines WL4–WL7. Bit line buffers 118 and 120 are assisted to handle four cells simultaneously by the already written cells connected to word lines WL1–WL3. Further word lines are activated after a delay determined by delay element 324, and so on.

In the shown example the word lines are successively activated in progressively increasing numbers. In another example, the delay line could include a respective delay element for each respective one of transistors 302–314 to activate word lines WL1–WL7 consecutively one at a time. Alternatively, the delay line could turn on transistors 302–314 in uniform groups of, say, four. In these examples, test means 126 could be integrated separately from other functional parts of the memory. The test means are far less time critical than the parts needed in the memory's operational mode. Accordingly, the designer is not forced to squeeze the test means into an area where it might affect the functional operation of the memory.

Figure 4:
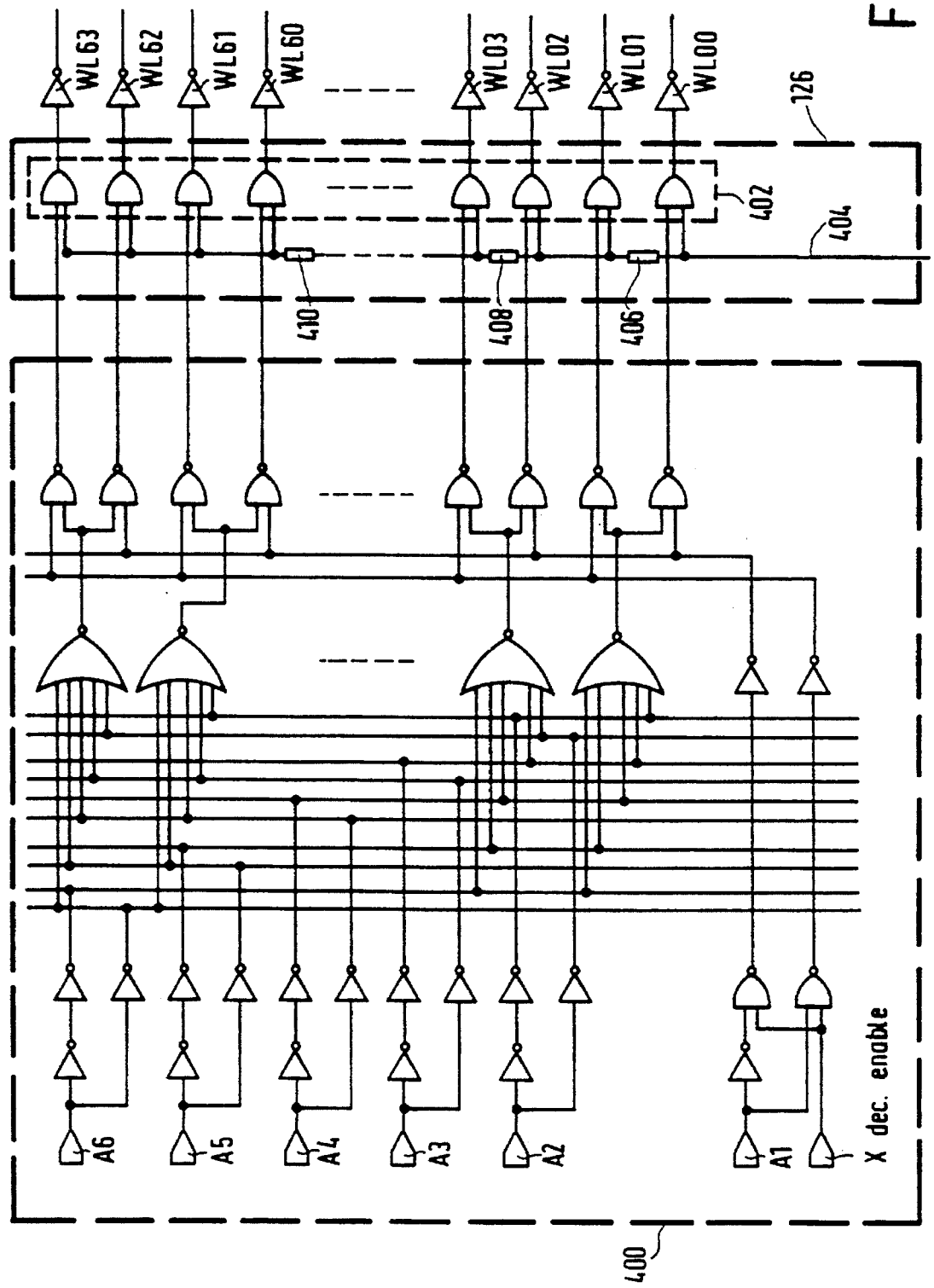

FIG. 4 gives a second implementation of test means 126 now merged with an address decoder 400 for the memory. Test means 126 now comprises an array 402 of two-input AND gates, each respective one thereof connected to a respective one of word line drivers WL00–WL63 in this example. One input of a specific one of the AND gates is connected to a specific output of address decoder 400, the other input is connected to a delay line 404. Delay line 404 creates delays between the activation of the AND gates when being pulled high. The delays may be distributed uniformly or non-uniformly as discussed above with reference to the first implementation. Here the delays are shown as delay elements 406, 408 and 410, etc, which may be elements physically present in the circuit or functional delays created by some clever interconnection between successive groups of AND gates.

FIGS. 5 and 6 illustrate the control of word lines WL1–WL5 in operational use and in the test mode, respectively. In FIG. 5, the operational mode is characterized by having at the most a single one of the word lines WL1–WL5 active at the time. In FIG. 6, the test mode is characterized by keeping all relevant word lines active during $I_{DDQ}$-measurement. This can be achieved, for example, by first activating word line WL1 and keeping it active, thereupon activating word lines WL2 and WL3 and keeping them active, thereupon activating a next group of word lines and keeping them active, etc.

I claim:

1. An electronic circuit having a plurality of respective memory cells coupled to a respective one of a plurality of word lines and to a pair of bit lines, characterized, in that the circuit comprises test means operative to render the plurality of word lines active in parallel by sequentially and cumulatively increasing a number of active word lines among the plurality of word lines.

2. The circuit of claim 1, wherein the test means is operative to activate the plurality of word lines sequentially.

3. The circuit of claim 1, wherein the test means is operative to progressively increase a number of active bit lines among the plurality of bit lines.

4. The circuit of claim 1, wherein the test means is operative to activate in parallel a first group of word lines and thereupon to activate in parallel a second group of word lines.

5. The circuit of claim 1, wherein the test means is operative to sequentially activate respective groups of respective increasing numbers of word lines.

6. A method of testing a plurality of respective memory cells coupled to a respective one of a plurality of word lines and to a pair of bit lines, characterized, in that the method comprises:

rendering the plurality of word lines active by sequentially cumulatively and increasing a number of active word lines among the plurality of word lines;

enabling writing a particular logic state in the memory cells connected to the word lines last made active;

monitoring a quiescent current when the plurality of word lines are active in parallel.

* * * * *